United States Patent

[11] 3,585,519

[72] Inventor Kenneth Burgess
Indianapolis, Ind.
[21] Appl. No. 866,809
[22] Filed Oct. 16, 1969
[45] Patented June 15, 1971
[73] Assignee The United States of America as represented by the Secretary of the Navy

[54] NARROW BAND INTERMEDIATE FREQUENCY AMPLIFIER
4 Claims, 3 Drawing Figs.

[52] U.S. Cl. ........................................ 330/21, 307/237, 330/29
[51] Int. Cl. ........................................ H03f 3/10
[50] Field of Search ........................................ 330/21, 29, 31; 307/237

[56] References Cited
UNITED STATES PATENTS
2,955,171 10/1960 Raper .......................... 330/21 X

*Primary Examiner*—Roy Lake
*Assistant Examiner*—James B. Mullins
*Attorneys*—R. S. Sciascia and H. H. Losche

ABSTRACT: A narrow band intermediate frequency (IF) amplifier having three stages coupled by double-tuned filters, each stage including a semiconductor amplifying element that is biased and loaded to give a slightly negative output resistance with a voltage protective diode in each stage, the protective diode in the last stage being a hot-carrier diode to provide low intermodulation distortion at high input signal levels between stages thereby producing output IF of narrow 3 decibels (db.) bandwidth for frequency modulation (FM) circuits.

| db DOWN FROM PEAK | BANDWIDTH MHz |
|---|---|
| 3 | 1.0 |
| 20 | 2.7 |
| 48 | 4.8 |
| 60 | 5.7 |
| 80 | 7.6 |

fo = 27.7 MHz
Gain = 55 → 60 db

INVENTOR.
KENNETH BURGESS

BY H. H. Losche

ATTORNEYS

INVENTOR.
KENNETH BURGESS
BY
H. H. Losche
ATTORNEYS

NARROW BAND INTERMEDIATE FREQUENCY AMPLIFIER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to IF amplifiers and more particularly to stable narrow band IF amplifiers.

In the past transistor amplifiers were used to perform the amplification requirement but these amplifiers were limited in dynamic range due to the methods of obtaining these dynamic range features. A system of automatic gain control (AGC) was used which requires detectors, filters, and distribution networks. These techniques resulted in limited dynamic range and intermodulation distortion. An inherent problem with transistor amplifiers at higher frequencies is the lower output shunt resistance. Much of this is due to single tuned coupling filters and transistors biased and loaded to operate on the positive resistance part of the characteristics curve which inherently amplifies an undesirably wide band around the IF.

SUMMARY OF THE INVENTION

In the present invention three stages of transistor amplifiers are coupled by double-tuned transformer filters. The double-tuned filters provide impedance matching and band-shaping in the interstage coupling. The transistor amplifying elements are biased and loaded to operate in the negative resistance part of the output characteristic curve to maintain narrow bandwidth of the IF signal, as for example, a bandwidth of 1 megahertz (MHz.) around an IF of center frequency 27.7 MHz. The secondary of each transformer coupling filter includes a diode to protect the transistor in that stage from high voltages, the diode in the third or last stage being a hot-carrier diode that, in addition, will switch rapidly at 0.2 of a volt to provide low intermodulation distortion for high input signal levels of the circuit. Further, the above combination also provides a very good linear phase response over a wide band of frequencies with approximately 48 db. per octave of skirt selectivity. It is accordingly a general object of this invention to provide an IF amplifier of a plurality of stages coupled by double-tuned transformer filters with a transistor amplifier in each stage that is biased and loaded to produce a negative resistance output, each coupling having a protective diode with the one in the last stage being a hot-carrier diode effective to operate at low threshold voltage to provide low intermodulation distortion for high input signal levels.

BRIEF DESCRIPTION OF THE DRAWING

These and other objects and the attendant advantages, features, and uses of the invention will become more apparent as a more detailed description continues when taken with the accompanying drawings in which.

DESCRIPTION OF THE PREFERRED EMBODIMENT

Figures 1, 3:
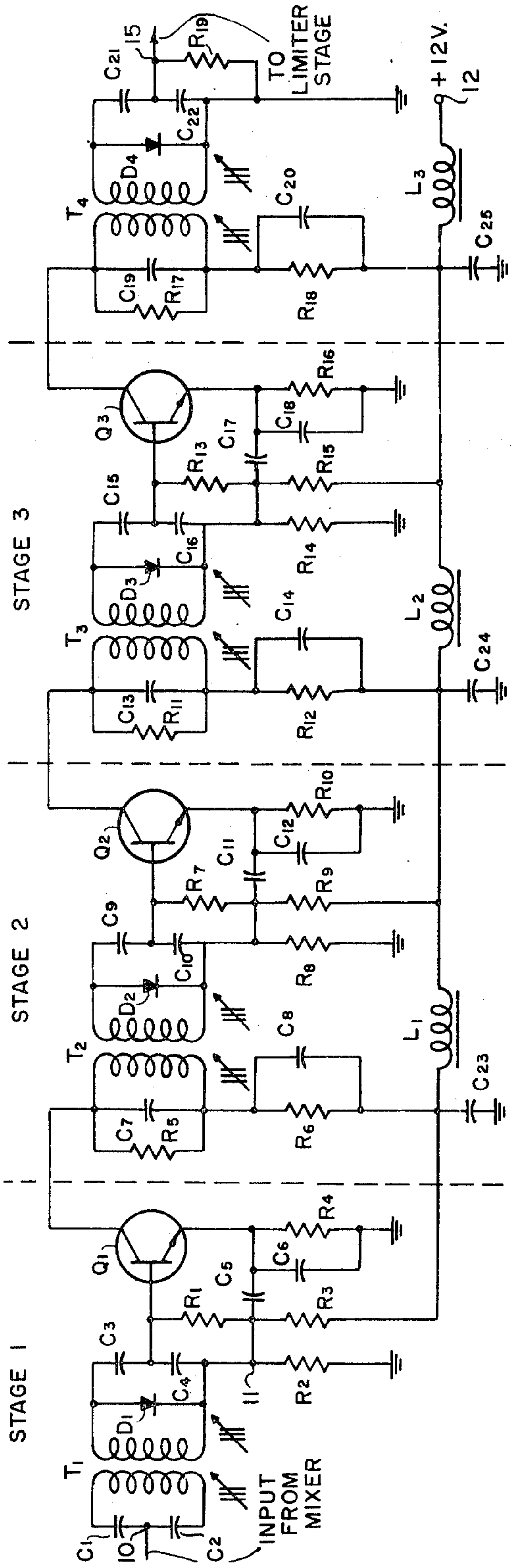
FIG. 1 is a circuit schematic of the three stages of the amplifier of this invention.
FIG. 3 is a table indicating the skirt selectivity of the amplifier.

Referring more particularly to FIG. 1, IF amplifier stages 1, 2, and 3 are illustrated in circuit schematic form from an input taken from a mixer circuit to the output to be applied to a limiter stage. The input to the first stage of the IF amplifier is to terminal 10 from the output of a preceding mixer through capacitors C1 and C2 to excite the primary winding of a transformer T1. The secondary winding of transformer T1 has a limiting diode D1 in parallel and also capacitors C3 and C4 in series with each other and in parallel to the secondary winding and to the diode D1. The terminal junction of the capacitors C3 and C4 provides an input to the base terminal of a transistor amplifier Q1, this base terminal being coupled through a resistor R1 and a resistor R2 to a fixed potential. The terminal point 11 of resistors R1 and R2 is coupled to the lower lead of the secondary winding of the transformer T1 and also through a resistor R3 to a DC supply voltage source at terminal 12 through decoupling inductances L1, L2, and L3. The resistor R1 provides a nearly constant input as a function of the frequency to the transistor Q1. Care must be taken in designing the remaining portion of the circuit to insure stability. A condition known as ground loop can develop and capacitor C5 is coupled between the emitter of transistor Q1 and the terminal 11 to prevent this condition in the input circuit of Q1. The emitter of transistor Q1 is loaded through the resistor R4 to a ground or fixed potential terminal, this resistor being paralleled by a capacitor C6 which provides bypassing of radio frequency (RF) for the stage. Resistors R2, R3, and R4 provide biasing and loading for the transistor Q1, this biasing and loading being of values to provide an output on the collector of transistor Q1 of slightly negative resistance. The diode D1 provides limiting of the input signal and the transformer T1, together with the capacitors C1, C2, C3, and C4, provide a combination to form a double tuned filter circuit for the input of the base electrode of transistor amplifier Q1. The double tuned filters, as T2, C7, C9, and C10 for stage 2, and T3, C13, C15, and C16, for stage 3, provide the coupling filters for interstage coupling and band shaping of the IF input frequency to be amplified. The resistors R5, R11, and R17 in the three stages are used to provide the precise bandwidth required in the stages. Resistors R6, R12, and R18 provide current limiting in the collector circuit for each of the stages. RF bypassing in the second and third stages are provided by the capacitors C12 and C18 in the same manner that the capacitor C6 functions in shunt to the resistor R4. The double-tuned filter circuits T1, T2, T3, and T4 with their related resistance-capacitance networks provide the impedance matching in coupling the amplifiers and provide band shaping for the IF band to be amplified. The three stages are substantially identical, as hereinbefore described, except that the limiting diode D3 in the third stage of amplification is a hot-carrier diode which limits switching to 0.2 of a volt instead of approximately 0.7 of a volt, as found in the usual diodes D1 and D2. This hot-carrier diode D3 lowers the limiting threshold lower than the other diodes in the first and second stages but retains the fast switching functions of the prior diodes. The output from the last stage taken from the collector of transistor amplifier Q3 is to the transformer filter circuit T4 through the capacitors C21 and C22 junction to produce an output 15 to a limiter stage or other means usable from an IF amplifier. The DC voltage supply is shown herein at terminal 12 to be 12 volts and each inductance L1, L2, and L3, has capacitors C23, C24, and C25, respectively, coupled to ground to filter out any alternating currents from the DC supply source 12. IF signals supplied to terminal 10 will accordingly be amplified with a very narrow bandwidth of 3 db. for not over 1 MHz. on the output of conductor 15.

OPERATION

Figure 2:
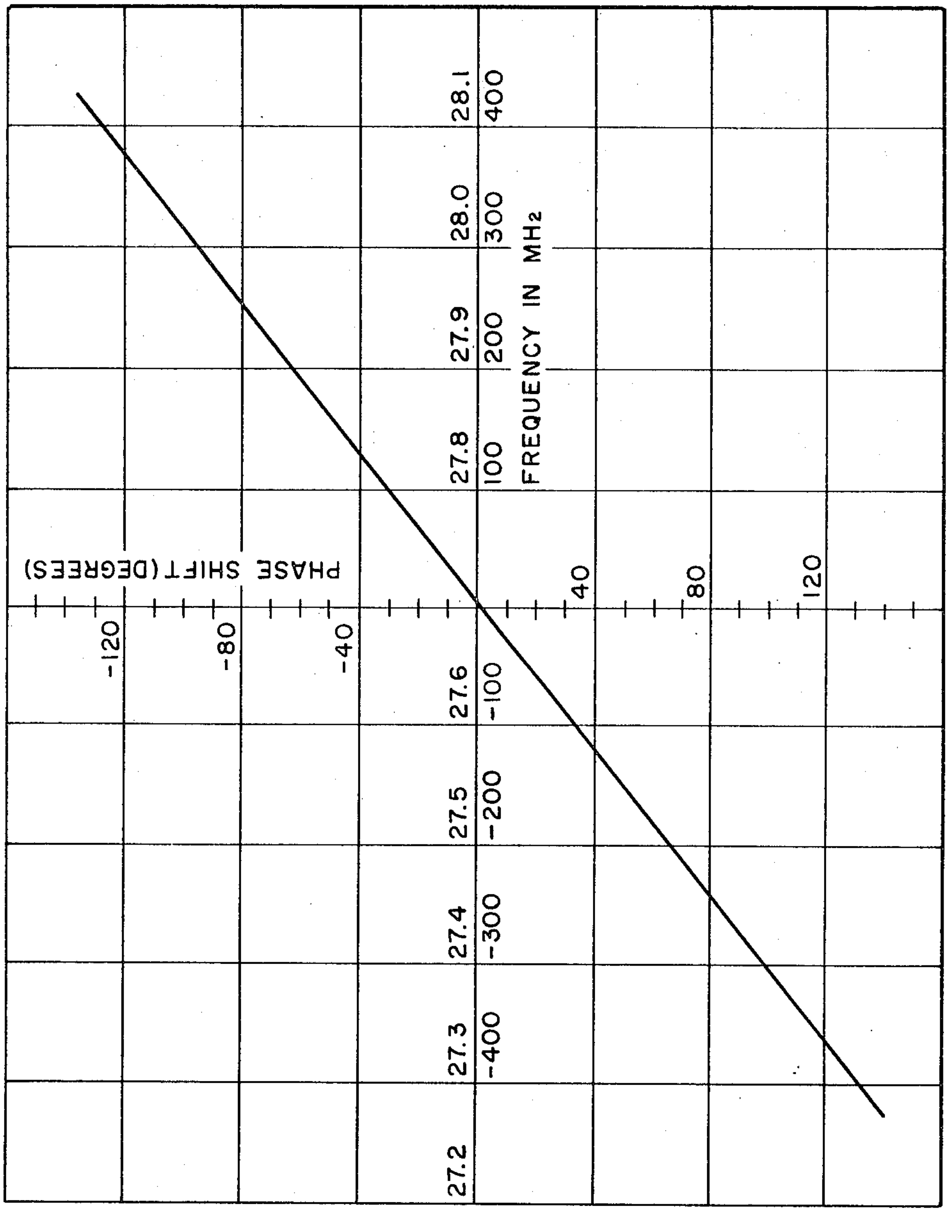
FIG. 2 is a graph of the phase response of the amplifier of this invention.

In the operation of this IF amplifier an overall gain for an input of 70 db. below 1 milliwatt (dbm.) is 60 db. An inherent problem with transistor amplifiers at higher frequency is the lower output shunt resistance. In order to achieve a 3 db. bandwidth of 1 MHz. the amplifying transistors Q1, Q2, and Q3 are each biased and loaded by the resistors R2, R3, and R4 and comparable resistors in stages 2 and 3 to give an output resistance slightly negative in each stage. The hot-carrier diode D3 must be placed in the correct stage, as shown in the third stage herein, in order to achieve the maximum benefit from this diode. Diode D3 contributes most to the low intermodulation distortion at high input signal levels. Another aspect of this amplifier is the linear phase response over a wide band band of frequencies and a very good skirt selectivity (approximately 48 db. per octave), this linear phase response being shown in FIG. 2 wherein the phase shift is shown from approximately −160° to 160° over 1 MHz. of frequency. The skirt selectivity is shown in FIG. 3. The advantages of this technique involves elimination of components needed for detection filtering and distribution of the ordinary gain control signal. The dynamic operating range is increased since the technique involves limiting the maximum amount of power applied to the three stages of amplification. The advantage of lower intermodulation distortion follows from limiting the input power to all the transistor stages. The hot-carrier diode D3 obtains a lower limit threshold than the other diodes D1 and D2 while still providing fast switching for the third stage. This circuit has the flexibility that even smaller bandwidths can be obtained. The operation of the three stages by proper biasing and loading of the transistor amplifiers to produce an output in the negative resistance part of the characteristic curve for the amplifier and the limiting threshold of the hot-carrier diode D3 makes it possible to produce this low 3 db. bandwidth at the IF frequency.

While many modifications and changes may be made in the preferred embodiment as shown and described herein it is to be understood that I desire to be limited in the spirit of my invention only by the scope of the appended claims.

I claim:

1. A narrow band intermediate frequency amplifier for frequency modulation circuits comprising:

a plurality of transistor amplifiers each biased and loaded to produce an output resistance slightly negative;

double-tuned filters with inputs and outputs connected to establish interstage couplings for said plurality of transistor amplifiers to provide impedance matching and frequency band shaping of conducted signals; and a diode in parallel with the output of each filter to protect each succeeding transistor amplifier from voltage overloads, said diode in the output of the filter of the last stage being a hot-carrier diode to provide a low limiting threshold voltage and a narrow bandwidth of output signal frequencies whereby intermediate frequency signals for frequency modulated circuits are amplified to produce a low 3 decibels bandwidth with minimum intermodulation distortion.

2. A narrow band intermediate frequency amplifier as set forth in claim 1 wherein said double-tuned filters are transformers having a resistor and a capacitor in parallel across the primary winding and two capacitors in series across the secondary winding in parallel with said diode, the input to said coupling double-tuned transformer filter being to one lead of said primary winding and the output being taken from the junction of said two capacitors in series whereby each of said primary windings and each of said secondary windings are tuned and filtered.

3. A narrow band intermediate frequency amplifier as set forth in claim 2 wherein said transistor amplifiers are each of base controlled NPN type and each said diode is oriented to limit positive going voltage signals.

4. A narrow band intermediate frequency amplifier as set forth in claim 3 wherein each said transistor amplifier has said interstage coupling input to the base electrode and includes a capacitor coupled between said base electrode and the emitter electrode through a base biasing resistance to minimize ground loop and to insure stability in the amplifier.